United States Patent
Zhao (10) Patent No.: US 8,846,527 B2
(45) Date of Patent: Sep. 30, 2014

(54) METHOD FOR FABRICATING MOS TRANSISTORS

(71) Applicant: Semiconductor Manufacturing International Corp., Shanghai (CN)

(72) Inventor: Neil Zhao, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/887,509

(22) Filed: May 6, 2013

(65) Prior Publication Data
US 2014/0191316 A1    Jul. 10, 2014

(30) Foreign Application Priority Data
Jan. 10, 2013    (CN) .......................... 2013 1 0009780

(51) Int. Cl.
*H01L 21/44*    (2006.01)

(52) U.S. Cl.
USPC ............ 438/655; 438/583; 438/649; 438/664

(58) Field of Classification Search
CPC .............. H01L 29/665; H01L 29/6656; H01L 29/6659; H01L 29/66507; H01L 21/823835
USPC ......... 438/303, 307, 592, 581, 582, 649, 651, 438/655, 663–664
See application file for complete search history.

(56) References Cited

U.S. PATENT DOCUMENTS

| | | | |
|---|---|---|---|
| 6,838,366 B2 * | 1/2005 | Iwai | 438/586 |
| 6,878,598 B2 * | 4/2005 | Jun et al. | 438/303 |
| 2007/0228464 A1 | 10/2007 | Wang et al. | |

* cited by examiner

*Primary Examiner* — Dung A. Le
(74) *Attorney, Agent, or Firm* — Anova Law Group, PLLC (57) ABSTRACT

A method is provided for fabricating an MOS transistor. The method includes providing a semiconductor substrate, and forming a gate structure having a gate dielectric layer and a gate metal layer on the semiconductor substrate. The method also includes forming offset sidewall spacers at both sides of the gate structure, and forming lightly doped regions in semiconductor substrate at both sides of the gate structure. Further, the method includes forming a first metal silicide region in each of the lightly doped regions, and forming main sidewall spacers at both sides of the gate structure. Further, the method includes forming heavily doped regions in semiconductor substrate at both sides of the gate structure and the main sidewall spacers, and forming a second metal silicide region in each of the heavily doped regions.

15 Claims, 5 Drawing Sheets

METHOD FOR FABRICATING MOS TRANSISTORS

CROSS-REFERENCES TO RELATED APPLICATIONS

This application claims the priority of Chinese patent application No. 201310009780.1, filed on Jan. 10, 2013, the entirety of which is incorporated herein by reference.

FIELD OF THE INVENTION

The present invention generally relates to the field of semiconductor manufacturing technology and, more particularly, relates to MOS transistors and fabrication techniques thereof.

BACKGROUND

Metal-oxide-semiconductor (MOS) transistors are basic devices of semiconductor manufacturing processes, and have been widely used in all types of integrated circuits (ICs). MOS transistors can be categorized into NMOS transistors and PMOS based on types of carriers and dopants used in the manufacturing processes.

FIGS. 1-4 illustrate semiconductor structures corresponding to certain stages of an existing fabrication process for forming a MOS transistor.

Figure 1:
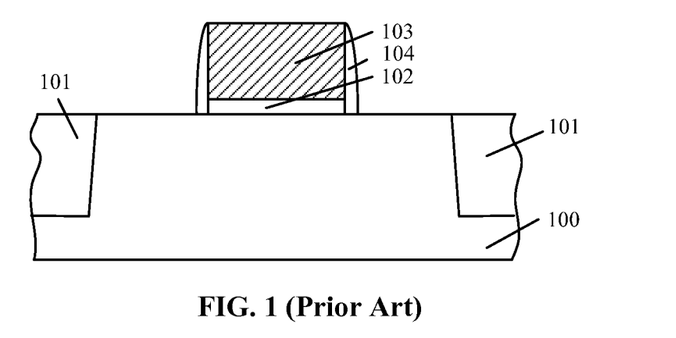
FIGS. 1-4 illustrate semiconductor structures corresponding certain stages of an existing fabrication process for a MOS transistor.

As shown in FIG. 1, a semiconductor substrate 100 is provided, and a gate structure having a gate dielectric layer 102 and a gate electrode 103 is sequentially formed on the semiconductor substrate 100. The process also includes forming an offset sidewall spacer 104 on surfaces of both sides of the gate structure, and forming shallow trench isolation structures 101 in the semiconductor substrate 100.

Figure 2:
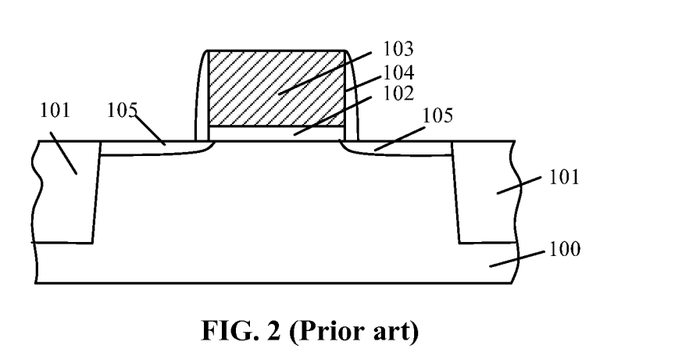
Figure 3:
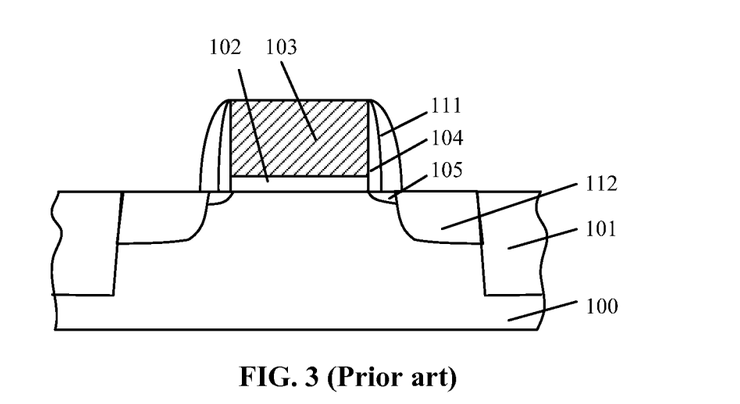

Further, as shown in FIG. 2, lightly doped regions 105 are formed in the semiconductor substrate 100 at both sides of the gate structure by a lightly doped ion implantation process using the gate structure and the offset sidewall spacer 104 as a mask. As shown in FIG. 3, a main sidewall spacer 111 is formed on a surface of the offset sidewall spacer 104, heavily doped regions 112 are formed in the semiconductor substrate 100 at both sides of the gate structure and the main sidewall spacer 111 by a source/drain ion implantation process using the gate structure and the main sidewall spacer 111 as a mask. Source/drain regions of the MOS transistor are formed by the lightly doped regions 105 and the heavily-doped regions 112.

Figure 4:
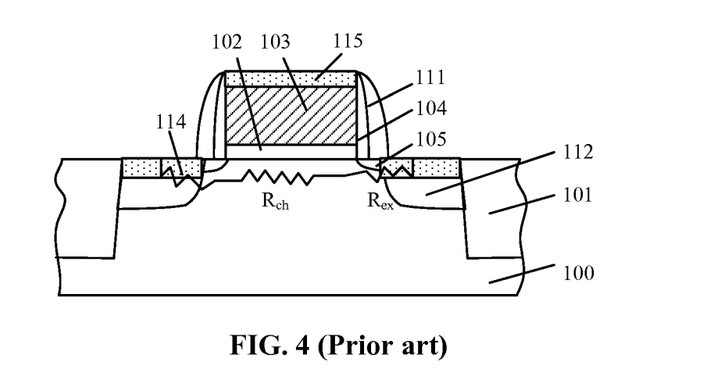

Further, as shown in FIG. 4, a first metal silicide region 114 is formed on a surface of the source/drain regions by a metal-silicide process. A second metal silicide contact 115 region is also formed on a surface of the metal gate 103 by the metal-silicide process.

However, the MOS transistor formed by the existing process may have a relatively large parasite resistance (may refer as $R_{external}$ in FIG. 4), and the relatively large parasitic resistance may affect performances of the MOS transistor. The disclosed device structures, methods and systems are directed to solve one or more problems set forth above and other problems.

BRIEF SUMMARY OF THE DISCLOSURE

One aspect of the present disclosure includes a method for fabricating a MOS transistor. The method includes providing a semiconductor substrate, and forming a gate structure on the semiconductor substrate. The method also includes forming offset sidewall spacers at both sides of the gate structure, and forming lightly doped regions in the semiconductor substrate at both sides of the gate structure. Further, the method includes forming a first metal silicide region in each of the lightly doped regions, and forming main sidewall spacers at both sides of the gate structure. Further, the method includes forming heavily doped regions in the semiconductor substrate at both sides of the gate structure and the main sidewall spacers, and forming a second metal silicide region in each of the heavily doped regions.

Another aspect of the present disclosure includes an MOS transistor. The MOS transistor includes a semiconductor substrate. The MOS transistor also includes a gate structure having a gate dielectric layer and a gate electrode layer on the semiconductor substrate. Further, the MOS transistor includes offset sidewall spacers and main sidewall spacers at both sides of the gate structure. Further, the MOS transistor also includes a first metal silicide region in each of lightly doped regions and a second silicide region in each of heavily doped region. The heavily doped regions and the lightly dope regions form source/drain regions of the MOS transistor.

Other aspects of the present disclosure can be understood by those skilled in the art in light of the description, the claims, and the drawings of the present disclosure.

DETAILED DESCRIPTION

References will now be made in detail to exemplary embodiments of the invention, which are illustrated in the accompanying drawings. Wherever possible, the same reference numbers will be used throughout the drawings to refer to the same or like parts.

In an existing fabrication process for a MOS transistor, in order to lower the surface resistance and the contact resistance of the gate region and the source/drain regions of the MOS transistor, a self-alignment technique may often be used to form a metal silicide layer on the surfaces of gate and source/drain regions. Although the metal silicide layer is already formed on the surface of the source/drain regions, the metal silicide layer may be near to the source/drain regions, a source/drain parasitic resistance (may refer as $R_{ex}$) of the MOS transistor may be still relatively large. A source/drain resistance ($R_s$) may be a sum of a channel resistance $R_{ch}$ and the source/drain parasitic resistance ($R_{ex}$), thus the measured source/drain resistance ($R_s$) may be relatively large too. The measured source/drain resistance may be in a range of approximately 200 $\Omega$/sq.

Figure 10:
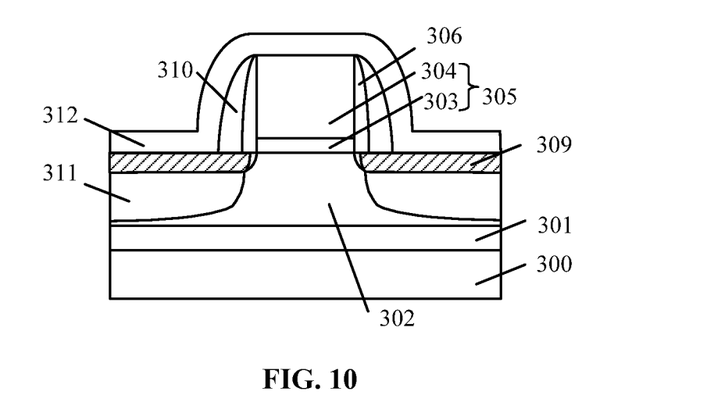
Figure 11:
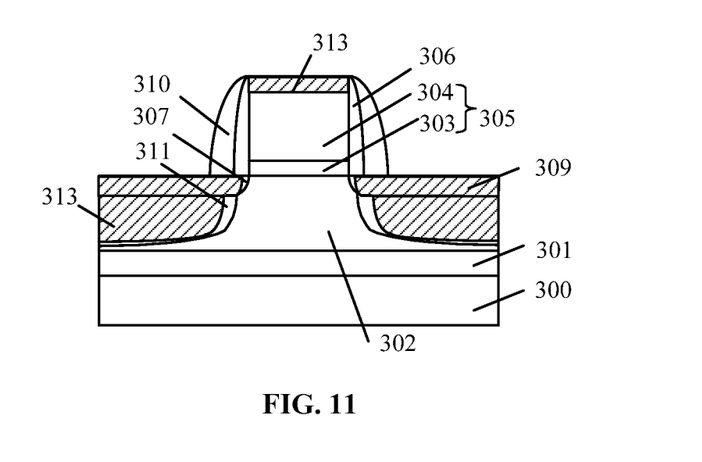
Figure 12:
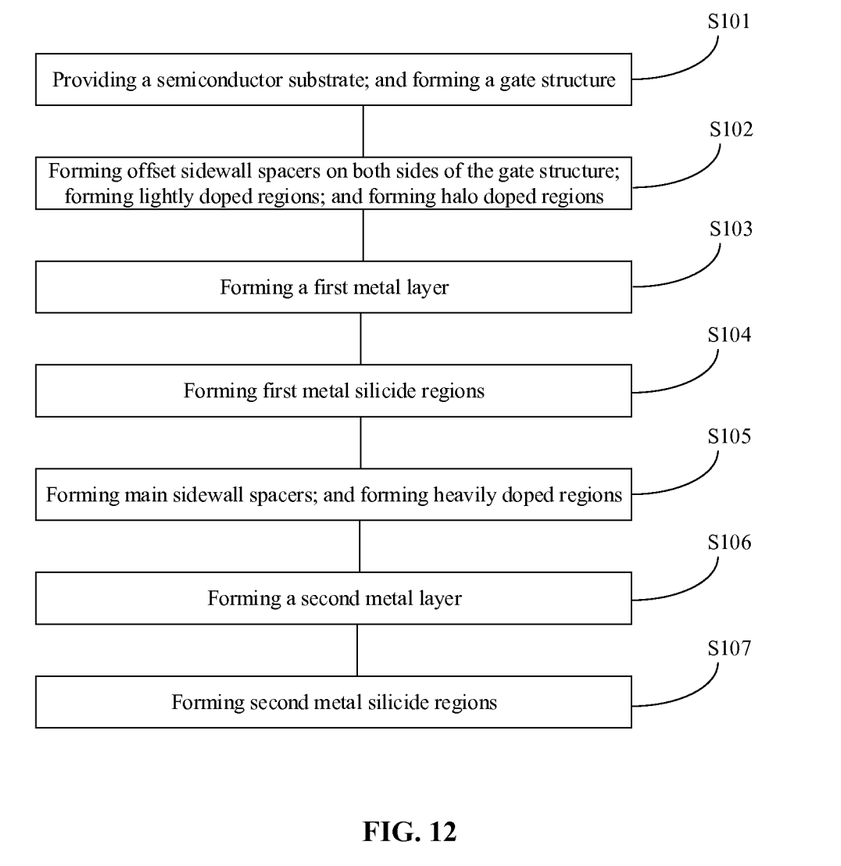
FIG. 12 illustrates an exemplary fabrication process for a MOS transistor consistent with the disclosed embodiments.

FIG. 12 illustrates an exemplary fabrication process for a MOS transistor, and FIGS. 5-11 illustrate exemplary semiconductor structures corresponding to various stages of the fabrication process.

Figure 5:
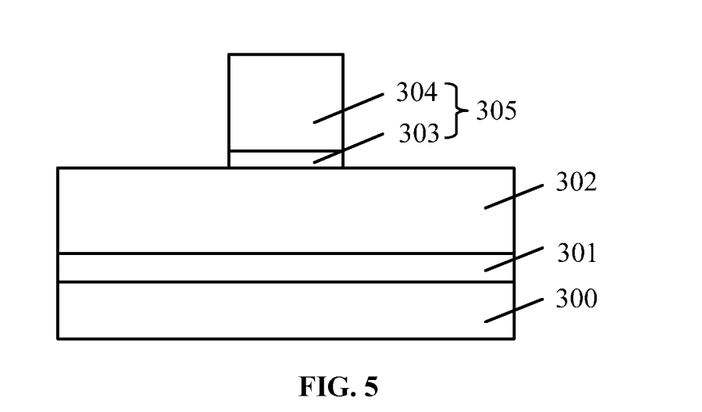
FIGS. 5-11 illustrate semiconductor structures corresponding to certain stages of an exemplary fabrication process for a MOS transistor consistent with the disclosed embodiments.

As shown in FIG. 12, at the beginning of the fabrication process, a semiconductor substrate with certain structures is provided (S101). FIG. 5 illustrates a corresponding semiconductor structure.

As shown in FIG. 5, a semiconductor substrate may be provided. The semiconductor substrate may include any appropriate materials, such as silicon, silicon on insulator (SOI), silicon germanium, carborundum, indium antimonide, lead telluride, indium arsenide, indium phosphide, gallium arsenidie, gallium antimonite, or ally semiconductor, etc.

In one embodiment, the semiconductor substrate is a SOI substrate. As shown in FIG. 5, the SOI substrate may have a base silicon 300, an isolator layer 301 on the base silicon 300, and a top silicon layer 302 on the isolator layer 301. The top silicon layer 302 may be with a <100> crystal orientation, or a <110> crystal orientation, etc. Other types of substrates, such as silicon on sapphire (SOS), etc., may also be used. For illustrative purposes, the SOI substrate may be used as the semiconductor substrate for the entire description. The SOI substrate provides a base for subsequent processes and structures.

After providing the SOI substrate, referring to FIG. 5, a gate structure 305 may be formed on the top silicon layer 302, the gate structure 305 may have a gate dielectric layer 303 and a gate electrode 304. The gate dielectric layer 303 may be made of any appropriate material, such as silicon oxide, or high-K dielectric material including one or more of $HfO_2$, $Al_2O_3$, $ZrO_2$, HfSiO, HfSiON, HfTaO, or HfZrO, etc. In one embodiment, the gate dielectric layer 303 is silicon oxide.

The gate electrode 304 may be made of any appropriate material, such as poly silicon, or other conductive material including one or more of W, Al, Cu, Ti, Ta, TaN, NiSi, CoSi, TiN, TiAl or TaSiN, etc. In one embodiment, the gate electrode 304 is poly silicon.

The gate structure 305 may be formed sequentially by: forming a gate dielectric material layer on the top silicon layer 302 and a gate material layer on the gate dielectric layer, followed by etching the gate material layer and the gate dielectric material layer. The gate material layer and the gate dielectric material layer may be formed by various processes, such as a chemical vapor deposition (CVD) process, a physical vapor deposition (PVD) process, or an atomic layer deposition (ALD) process, etc. An etching process for etching the gate dielectric material layer and the gate material layer may be a plasma etching process, an ion beam etching process, or a wet chemical etching process, etc.

When the SOI substrate is used, leakage currents between semiconductor devices may be reduced. Further, a thickness of the top silicon layer 302 may be a constant and, thus, when source/drain regions of MOS transistors are formed in the top silicon layer 302, it may be easy to control depths of lightly doped regions and heavily doped regions. Further, because areas of subsequently formed a first metal silicide region and a second silicide region may be equivalent to, i.e., may be equal to or slightly smaller than, areas of the lightly doped region and the heavily doped region, respectively, it may also be easy to control the areas of the first metal silicide region and the second metal silicide region when the first metal silicide region and the second silicide region are formed. The thickness of the top silicon layer 302 may be in a range of approximately 50 nm~100 nm, and the thickness of the top silicon layer 302 may be equivalent to a total thickness of the subsequently formed lightly doped region and the heavily doped region. Thus, difficulties of fabrication processes for forming the first metal silicide region and the second metal silicide region in the lightly doped region and the heavily doped region may be reduced.

Before forming the gate structure 305 on the top silicon layer 302, a well region (not shown) may be formed in the top silicon layer 302. When the MOS transistor is NMOS, the well region is a P type region. When the MOS transistor is PMOS, the cell region is an N type region. The cell region may be formed by any appropriate process, such as thermal diffusion process, or an ion implantation process, etc.

Further, shallow trench isolation (STI) structures (not shown) may also be formed in the top silicon layer 302. The STI structures may used to isolate adjacent active regions. The STI structures may be made of any appropriate material, such as silicon oxide, silicon nitride, or silicon oxynitride, etc. In one embodiment, the STI structures are made of silicon oxide.

The STI structures may be formed sequentially by: forming shallow trenches, and filling the shallow trenches with an isolation material. The shallow trenches may be formed by etching the top silicon layer 302 by a dry etching process, or a wet etching process, etc. Various processes may be used to fill the shallow trenches to form the STI structures, such as a CVD process, a PVD process, or a flowable CVD (FCVD) process, etc.

Figure 6:
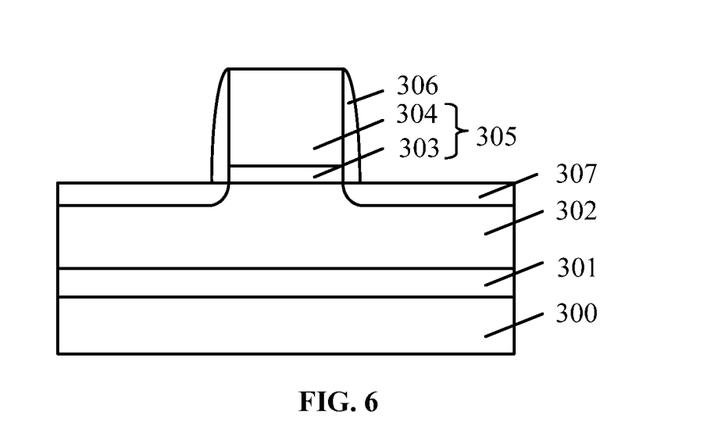

Returning to FIG. 12, after providing the substrate with certain structures, offset sidewall spacers may be formed on both side of the gate structure 305 (S102). FIG. 6 illustrates a corresponding semiconductor structure.

As shown in FIG. 6, offset sidewall spacers 306 are formed on both sides of the gate structure 305. The offset sidewall spacers 306 may be made of any appropriate material, such as silicon oxide, silicon nitride, or silicon oxynitride, etc. Various processes may be used to form the offset sidewall spacers 306, such as a thermal oxidation process, a CVD process, a PVD process, or an FCVD process, etc. In one embodiment, the offset sidewall spacers 306 are made of silicon oxide or silicon nitride formed by a thermal oxidation process, or a CVD process, etc.

The offset sidewall spacers 306 may be used as protection layers of the gate structure 306 when a subsequent ion implantation process is performed. The sidewall spacers 306 may also be used as isolation layers between the gate electrode 304 and a subsequently formed first metal layer when a first metal-silicide process is performed.

Various widths may be designed for the offset sidewall spacers 306. In one embodiment, the width of the offset sidewall spacers 306 may be in a range of approximately 4 nm~8 nm. Referring to FIG. 6, the width of the offset sidewall spacers 306 may refer to a maximum thickness of a portion of the offset sidewall spacers 306 on the surface of the top silicon layer 302. The sidewall spacers 306 with the width may prevent metal of a subsequently formed first metal layer from penetrating through offset sidewall spacers 306 to react with silicon in the gate electrode 304. An optimum distance between the first metal layer and a channel region may also be obtained. Further, there may be enough silicon on the bottom of the offset sidewall spacers 306 to react with a first metal during a first metal-silicide process, and the first metal may be unable to diffuse to the channel region under the gate structure 305 because a first metal silicide is formed during the first metal-silicide process. Thus, an area of the first metal silicide may be equivalent to an area of a subsequently formed lightly doped region. Further, an optimum distance between the lightly doped region and the gate 304 may be obtained, and it may prevent a generation of gate-induced drain leakage (GIDL).

Further, referring to FIG. 6, after forming the offset sidewall spacers 306, lightly doped regions (may also refer as lightly doped drain, LDD) 307 may be formed in the top silicon layer 302 at both sides of the gate structure 305 and the offset sidewall spacers 306. The lightly doped regions 307 may be formed by lightly doping portions of the top silicon layer 302 at both sides of the gate structure 305 and the offset sidewall spacers 306 using the gate structure 305 and the offset sidewall spacers 306 as a mask. A lightly doping process may include an ion implantation process, or a thermal diffusion process, etc. In one embodiment, the lightly doping process is an ion implantation process.

Various appropriate ion implantation parameters may be used to perform the lightly doping process. For an NMOS transistor, doping ions may be any appropriate N type ions including phosphor ions, arsenic ions, or antimony ions, etc. An energy of an N type ion implantation process may be in a range of approximately 0.5 KeV~4 KeV. A dose of the N type ion implantation process may be in a range of approximately 1E13 atoms/cm$^2$~2E15 atoms/cm$^2$.

For a PMOS transistor, doping ions may be any appropriate P type ions including boron ions, gallium ions, or indium ions, etc. An energy of a P type ion implantation process may be in a range of approximately 2 KeV~5 KeV. A dose of the P type ion implantation process may be in a range of approximately 1E13 atoms/cm$^2$~2E15 atoms/cm$^2$.

A depth of the lightly doped regions 307 may be in a range of approximately 15 nm~30 nm. The depth of the lightly doped regions 307 may refer to a vertical distance between the top surface of the top silicon layer 302 and a bottom surface of the lightly doped regions 307.

Optionally, before the lightly doping ion implantation process, a hard mask layer may be formed on the gate electrode 304. The hard mask layer may be made of silicon oxide, or silicon nitride, etc. The hard mask layer may be formed by any appropriate process, such as a CVD process, a PVD process, or an ALD process, etc. The hard mask layer may be used to protect the gate electrode 304 during the ion implantation process.

After forming the lightly doped regions 307, a first low dose halo ion implantation process may be performed in a portion of the top silicon layer 302 on the bottom of the gate electrode 305, and halo regions (not shown in FIG. 6) may be formed in the portion of the top silicon layer 302 on the bottom of the gate electrode 305. The halo regions may be use to prevent a short channel effect. A doping type of the first halo ion implantation may be opposite to a doping type of a source/drain ion implantation. An energy of the first halo ion implantation process may be in a range of approximately 30 KeV~60 KeV. A dose of the first halo ion implantation process may be in a range of approximately 5E12 atoms/cm$^2$. An angle of the first halo ion implantation process may be in a range of approximately 0~40°. The angle of the first halo ion implantation process may refer to an angle between an ion beam of the first halo ion implantation process and a normal of the base silicon 300.

Further, after the first halo ion implantation process, a thermal annealing process may be performed on the SOI substrate. The thermal annealing process may be used to activate the doping ions. A temperature of the thermal annealing process may be in a range of approximately 950° C.~1100° C.; and a duration of the thermal anneal process may be in a range of approximately 20 s~30 s. A laser annealing process may also be used to anneal the SOI substrate. A temperature of the laser annealing process may be in a range of approximately 1200° C.~1300° C.; and a duration of the laser annealing process may be in range of approximately 30 s~60 s.

Figure 7:
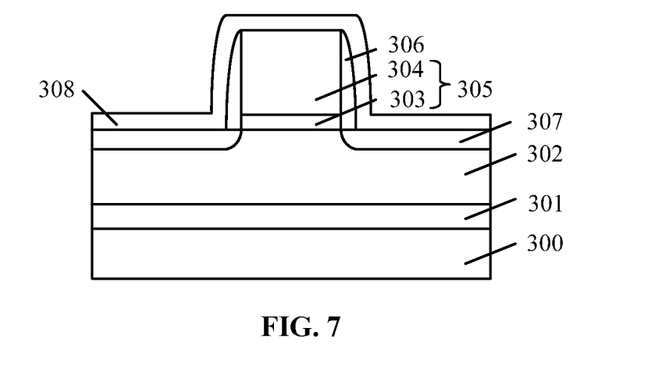

Returning to FIG. 12, after forming the lightly doped regions 307, a first metal layer 308 may be formed (S103). FIG. 7 illustrates a corresponding semiconductor.

As shown in FIG. 7, a first metal layer 308 is formed on the top silicon layer 302; and the first metal layer may also cover the offset sidewall spacers 306 and the top surface of the gate structure 305. The first metal layer 308 may be used as a metal source of a subsequently formed first metal silicide. The first metal layer 308 may be made of any appropriate metal, such as nickel, platinum, chromium, gold, or iridium, etc. Nickel silicide and platinum silicide may have a relatively small resistance, in one embodiment. The first metal layer 308 is nickel.

A thickness of the first metal layer 308 may be in a range of approximately 10 nm~50 nm. Various processes may be used to form the first metal layer 308, such a CVD process, a PVD process, or an electroplating process, etc.

Figure 9:
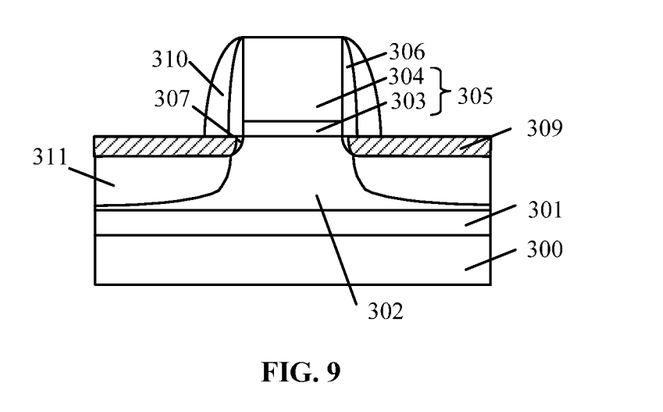

Returning to FIG. 12, after forming the first metal layer 308, a first metal silicide layer may be formed (S104). FIG. 9 illustrates a corresponding semiconductor structure.

As shown in FIG. 9, a first silicide layer 309 is formed in each of the lightly doped regions 307. The first silicide layer 309 may be formed by annealing the first metal layer 308 using a first annealing process. Metal in the first metal layer 308 may react with silicon in the lightly doped regions 307, and form the first silicide layer 309 during the first annealing process. An area of the first metal silicide layer 309 may be equivalent to an area of the lightly doped regions 307, that is, the area of the first metal silicide layer 309 may be slightly smaller than, and/or almost equal to the area of the lightly doped regions 307. After the first annealing process, unreacted metal in the first metal layer 308 may be removed.

Figure 8:
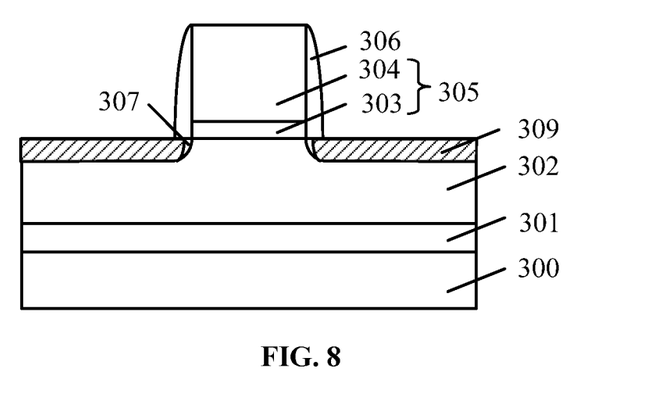

A temperature of the first annealing process may be in a range of approximately 300° C.~600° C.; a duration of the first annealing process may be in a range of approximately 10 s~30 s. Referring to FIG. 8, after the first annealing process, the area of the first metal silicide layer 309 may be equivalent to the area of the lightly doped region 307, a portion of the first metal silicide layer 309 may be under a bottom of the first offset sidewall spacer 306, a distance between the first metal silicide 309 and the gate structure 305 may be reduced, thus a parasitic resistance may be further reduced. A metal silicide layer (not shown) may also be formed on the top surface of the gate electrode 304 if the top surface of the gate electrode 304 is not covered by certain materials.

Returning to FIG. 12, after forming the first metal silicide layer 309, main sidewall spacers may be formed on both sides of the offset sidewall spacers 306 (S105). FIG. 9 illustrates a corresponding semiconductor structures.

As shown in FIG. 9, main sidewalls spacers 310 are formed on both sides of the offset sidewalls spacers 306. The main sidewall spacers 310 may be a single layer or a stacked layer consisting of different materials. The main sidewall spacers 310 may be made of any appropriate material, such as silicon oxide, silicon nitride, or silicon oxynitride, etc. In one embodiment, the main sidewall spacers 310 are doubly stacked layers consisting of a silicon oxide layer and a silicon nitride layer.

The main sidewall spacers 310 may be formed by sequentially: depositing a sidewall spacer material layer, and performing an etch back process. The sidewall spacer material layer may be deposited by any appropriate process, such as a CVD process, a PVD process, or an FCVD process, etc. The etch back process may include a plasma etching process, an ion beam etching process, or a wet chemical etching process, etc.

Further, after forming the main sidewall spacers 310, a source/drain ion implantation process may be performed in the top silicon layer 302 using the gate structure 305 and the main sidewall spacers 310 as a mask. Referring to FIG. 9, heavily doped regions 311 are formed at both sides of the gate structure 305 and the main sidewall spacers 310 in the top silicon layer 302 by the source/drain ion implantation process. The heavily doped regions 311 and the lightly doped regions 307 may form source/drain regions of a MOS transistor.

Various appropriate ion implantation parameters may be used to perform the source/drain ion plantation process. For an NMOS transistor, doping ions may be any appropriate N type ions including phosphor ions, arsenic ions, or antimony ions, etc. An energy of the source/drain implantation process may be in a range of approximately 5 KeV~20 KeV. A dose of the source/drain ion implantation process may be in a range of approximately 1E14 atoms/cm$^2$~5E16 atoms/cm$^2$.

For a PMOS transistor, doping ions may be any appropriate P type ions including boron ions, gallium ions, or indium ions, etc. An energy of a P type source/drain ion implantation process may be in a range of approximately 5 KeV~20 KeV. A dose of the source/drain ion implantation process may be in a range of approximately 1E14 atoms/cm$^2$~5E16 atoms/cm$^2$.

A total width of the offset sidewall spacers 306 and the main sidewall spacers 310 may be greater than the depth of the lightly doped regions 307. Correspondingly, the total width of the offset sidewall spacers 306 and the main sidewall spacers 310 may be greater than the depth of the first metal silicide region 309, thus a width of a portion of the first metal silicide region under the offset sidewall spacers 306 and the main sidewall spacers 310 may be greater than a thickness of the first metal silicide region 309.

When a second metal-silicide process is performed, a second metal penetrating through the first metal-silicide region 309 may firstly contact with silicon of the heavily doped region 311 under the bottom of the first metal silicide region 309, and react with the silicon of the heavily doped region 311 to form a metal silicide. Since the metal penetrating through the bottom of the first metal silicide region 309 may be quickly consumed up, more metal may diffuse from the surface of the first metal silicide region 309 to the bottom of the first metal silicide region 309.

This diffusion process may cause the second metal to have a larger vertical diffusion rate (may refer to a diffusion rate from the surface of the first metal silicide region 309 to the bottom of the first metal silicide region 309) than a lateral diffusion rate (may refer to a diffusion rate along the bottom of the main sidewall spacers 310 to the channel region). The larger vertical diffusion rate may cause a width of a second metal silicide region formed under the bottom of the offset sidewall spacers 303 and the main sidewall spacers 310 to be smaller than a depth of the second metal silicide region.

Thus, an area of the second metal silicide region may be equivalent to an area of the heavily doped region 311, a short-channel effect may be prevented. In certain embodiments, a width of the main sidewall spacer 310, i.e., a maximum width of the main sidewall spacers 310 on the top silicon 302, may be in range of approximately 15 nm~30 nm.

A depth of the heavily doped regions 311 may refer to a vertical distance between the top surface of the top silicon layer 302 to a bottom surface of the heavily doped regions 311. The depth of the heavily dope regions 311 may be greater than the depth of the lightly doped regions 307. In one embodiment, the depth of the heavily doped regions 311 may be in a range of approximately 50 nm~100 nm.

After forming the heavily doped regions 311, a low temperature ion diffusion process may be performed to cause doped ions to have a better diffusion. In one embodiment, a temperature of the ion diffusion process may be in a range of approximately 300° C.~600° C. A duration of the ion diffusion process may be in a range of approximately 10 s~60 s.

In certain other embodiments, source/drain regions may be formed by an embedding process. The embedding process may include: etching portions of the top silicon layer 302, and forming the source/drain regions by growing certain material at the portions etched. The etching process may include a dry etching process, or wet etching, etc. A depth etched by the etching process may be in a range of approximately 10 nm~80 nm.

The embedded source/drain regions may be made of any appropriate material, such as $Si_{1-x}Ge_x$ (x may refer as a molar percentage of Ge), SiC, or metal etc. In one embodiment, the source/drain regions are made of $Si_{1-x}Ge_x$; and x may be in a range of approximately 3%~15%.

Various processes may be used to form the source/drain regions, such as a CVD process, a PVD process, an FCVD process, an electroplating process, or a selective epitaxial process, etc. In one embodiment, the source/drain regions are formed by a selective epitaxial process.

After forming the source/drain regions, a second halo ion implantation process may be performed. A dose of the second ion implantation process may be lower than the first halo ion implantation process. In one embodiment, the dose of the second halo ion implantation process may be in a range of approximately 5E12 atoms/cm$^2$~2E13 atoms/cm$^2$.

Returning to FIG. 12, after forming the heavily doped regions 311, a second metal layer may be formed (S106) on the top silicon layer 302. FIG. 10 illustrates a corresponding semiconductor structure.

As shown in FIG. 10, a second metal layer 312 is formed on the top silicon layer 302. The second metal layer 312 may also cover surfaces of the main sidewall spacers 310 and the gate structure 305.

The second metal layer 312 may be a metal source for a subsequent second metal-silicide process. Various materials may be used for the second metal layer 312, such as nickel, platinum, gold, copper, or titanium etc. Nickel silicide and platinum silicide may have a relatively small resistance. In one embodiment, the second metal layer 312 is made of nickel.

The second metal layer 312 may be formed by any appropriate process, such as a PVD process, a CVD process, or an electroplating process, etc. A thickness of the second metal layer 312 may be any appropriate value. In one embodiment, the thickness of the second metal layer 312 is in a range of approximately 30 nm~100 nm.

Returning to FIG. 12, after forming the second metal layer 312, a second metal silicide region may be formed (S107). FIG. 11 illustrates a corresponding semiconductor structure.

As shown in FIG. 11, a second metal silicide region 313 is formed in each of the heavily doped regions 311. The second silicide region 313 may be formed by annealing the second metal layer 312. During an annealing process, metal in the second metal layer 312 may penetrate through the first metal silicide region 309, and react with silicon in the heavily doped regions 311 to form a second metal silicide. The annealing process may refer as a second annealing process. After forming the second silicide region 313, unreacted metal of the second metal layer 312 may be removed. An area of the second silicide region 313 may be equivalent to, i.e., equal to and/or slightly smaller than, an area of the heavily doped regions 311.

The second annealing process may be a thermal annealing process, or a laser annealing process, etc. A temperature of the second annealing process may be in a range of approximately 300° C.~600° C. A duration of the second annealing process may be in a range of approximately 20 s~60 s.

When the second annealing process is performed, a metal silicide region may also be formed in the surface of the gate electrode 304.

After forming the second metal silicide region 313, silicon in source/drain regions formed by the heavily doped regions 311 and the lightly doped regions 307 may be substantially substituted by the metal silicide(s), and source/drain parasitic resistances of the MOS transistor may be significantly reduced. In one embodiment, the source/drain parasitic resistance of the MOS transistor may be in a range of approximately 20 Ω/sq. Thus, performances of the MOS transistor may be enhanced.

Thus, an MOS transistor may be formed by above disclosed methods and processes, a corresponding MOS transistor is illustrated in FIG. 11. The MOS transistor includes a SOI substrate having a base silicon 300, a dielectric layer 301 and a top silicon layer 302. The MOS transistor also includes a gate structure 305 having a gate dielectric layer 303 and a gate electrode layer 304 on the top silicon layer 302. Further, the MOS transistor includes offset sidewall spacers 306 and main sidewall spacers 310 at both sides of the gate structure 305. Further, the MOS transistor also includes a first metal silicide region 309 in each of lightly doped regions 307 and a second silicide region 313 in each of heavily doped regions 311. The heavily doped regions 311 and the lightly dope regions 307 form source/drain regions of the MOS transistor. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an MOS transistor, comprising:
   providing a semiconductor substrate;
   forming a gate structure on the semiconductor substrate;
   forming offset sidewall spacers at both sides of the gate structure;
   forming lightly doped regions in portions of the semiconductor substrate at both sides of the gate structure and the offset sidewall spacers;
   forming a metal silicide region at each of the lightly doped regions;
   forming main sidewall spacers on both sides of the off sidewall spacers;
   forming heavily doped regions in portions of the semiconductor substrate at both sides of the main sidewall spacers; and
   forming a second metal silicide region in each of the heavily doped regions.

2. The method according to claim 1, wherein:
   the semiconductor substrate is a silicon on insulator substrate having a base silicon, a dielectric layer on the base silicon and a top silicon layer on the dielectric layer, and the portions of the semiconductor substrate are in the top silicon layer of the silicon on isolator substrate.

3. The method according claim 1, wherein:
   the first silicide region and the second silicide region are nickel silicide regions or platinum silicide regions.

4. The method according to claim 1, wherein forming the first silicide region further includes:
   forming a first metal layer on a top surface of the semiconductor substrate;
   annealing the first metal to react with silicon in the lightly doped region; and
   removing unreacted metal of the first metal layer.

5. The method according to claim 1, wherein forming the second metal silicide region further includes:
   forming a second metal layer on one top surface of the semiconductor substrate;
   annealing the second metal to react with silicon in the heavily doped region; and
   removing unreacted second metal layer.

6. The method according to claim 1, wherein:
   a depth of the lightly doped region is a range of approximately 15 nm~30 nm; and
   a depth of the heavily doped region is a range of approximately 50~100 nm.

7. The method according to claim 1, after forming the lightly dope region, further including:
   forming halo doped regions by a first low dose halo ion implantation process.

8. The method according to claim 1, after forming the heavily doped regions, further including:
   performing a low temperature diffusion process.

9. The method according to claim 1, wherein:
   a width of the offset sidewall spacers is in a range of approximately 4 nm~8 nm; and
   a width of the main sidewall spacer in in a range of approximately 15 nm~30 nm.

10. The method according to claim 1, wherein:
    an area of the first metal silicide region is equivalent to an area of the lightly doped region; and
    an area of the second metal silicide region is equivalent to an area of the heavily doped region.

11. The method according to claim 1, after forming the first metal silicide layer, further including:
    etching portions of the lightly doped regions at both sides of the gate structure;
    forming source drain regions by a selective epitaxial process; and
    performing a second halo ion implantation process.

12. The method according to claim 5, wherein:
    the second metal layer is made of nickel or platinum; and
    a thickness of the second metal layer is in a range of approximately 30 nm~100 nm.

13. The method according to claim 1, wherein:
    an annealing temperature for forming the first metal silicide and the second metal silicide is a range of approximately 250° C.~450° C.

14. The method according to claim 7, wherein:
    an energy of the first halo ion implantation process is in a range of approximately 30 KeV~60 KeV;
    a dose of the first halo ion implantation process is in a range of approximately 1E13 atoms/cm$^2$~5E13 atoms/cm$^2$; and
    an angle of the first halo ion implantation process is in a range of approximately 0°~40°.

15. The method according to claim 11, wherein:
    a dose of the second halo ion implantation process is in a range of approximately 5E12 atoms/cm$^2$~2E13 atoms/cm$^2$.

* * * * *